United States Patent [19]

Hanak

[11] Patent Number: 4,593,644

[45] Date of Patent: Jun. 10, 1986

[54] CONTINUOUS IN-LINE DEPOSITION SYSTEM

[75] Inventor: Joseph J. Hanak, Lawrenceville, N.J.

[73] Assignee: RCA Corporation, Princeton, N.J.

[21] Appl. No.: 545,741

[22] Filed: Oct. 26, 1983

[51] Int. Cl.[4] .............................................. C23C 14/56
[52] U.S. Cl. .................................... 118/719; 118/723; 118/724; 118/725; 118/728; 118/729; 118/733; 118/50.1; 118/500
[58] Field of Search ............... 118/725, 50.1, 719, 118/729, 733, 724, 500, 728, 723; 414/217; 104/165

[56] References Cited

U.S. PATENT DOCUMENTS

| | | | |
|---|---|---|---|
| 3,602,192 | 8/1971 | Grochowski et al. | 118/719 X |
| 3,659,551 | 5/1972 | McKinstry | 118/719 |
| 3,705,714 | 12/1972 | Alliegro | 263/47 R |
| 3,805,736 | 4/1974 | Foehring et al. | 118/719 |
| 3,877,134 | 4/1975 | Shanahan | 118/500 |
| 4,033,287 | 7/1977 | Alexander, Jr. et al. | 118/49.1 |
| 4,047,624 | 9/1977 | Dorenbos | 118/719 X |
| 4,137,550 | 1/1979 | Kaganowicz et al. | 358/128 |
| 4,152,535 | 5/1979 | Deminet et al. | 136/89 TF |
| 4,282,268 | 8/1981 | Priestley et al. | 427/39 |
| 4,309,241 | 1/1982 | Garavaglia et al. | 18/718 X |
| 4,313,254 | 2/1982 | Feldman et al. | 29/572 |
| 4,328,258 | 5/1982 | Coleman | 118/723 X |
| 4,379,181 | 4/1983 | Cannella et al. | 427/39 |
| 4,389,967 | 6/1983 | Shimoda et al. | 118/729 X |
| 4,450,786 | 5/1984 | Doehler et al. | 118/719 |
| 4,461,783 | 7/1984 | Yamazaki | 427/86 X |

Primary Examiner—John D. Smith
Attorney, Agent, or Firm—Birgit E. Morris; Donald S. Cohen; James M. Trygg

[57] ABSTRACT

A continuous, in-line deposition system is disclosed for coating large substrates. The apparatus includes load-lock chambers for loading and unloading substrates arranged in carriers. The carriers transport through the apparatus a plurality of pairs of substrates with their principal faces, that is faces to be coated, held in a plane that is both parallel to the electric field of the glow discharge reaction and perpendicular to the direction of motion of the substrates through the apparatus.

7 Claims, 17 Drawing Figures

CONTINUOUS IN-LINE DEPOSITION SYSTEM

The present invention relates to deposition apparatus for forming semiconducting and insulating films which are utilized in mass-production of semiconductor devices.

BACKGROUND OF THE INVENTION

Methods and apparatus for the deposition of semiconducting and insulating films in the manufacture of semiconductor devices are either batch or continuous systems. In such systems one or more substrates are arranged in a deposition chamber so that their principal faces, i.e., those being coated, are substantially coplanar. The deposition is effected by the decomposition of a reactive gas which may be activated in several ways. The first of two more usual ways is by heating the gas sufficiently as is done in the Low Pressure Chemical Vapor Deposition Method (LPCVD) and the second is by subjecting the gas to a glow discharge. One variation of the latter is known in the art as the positive column glow discharge method wherein a pair of electrodes having a potential impressed thereon, one electrode being positioned on each side of the substrates, activate a reactant gas such as silane whereupon a glow discharge is initiated in the space between the electrodes resulting in deposition of amorphous silicon on the surfaces of the substrates. See, for example, U.S. Pat. No. 4,033,287, issued July 5, 1977 to Alexander, Jr. et al, which discloses a glow discharge reactor apparatus of this type.

Existing types of apparatus for continuous deposition of films onto substrates utilize a coplanar orientation of the principal faces of the substrates to be coated. One form of such a system is described in U.S. Pat. No. 4,313,254, issued Feb. 2, 1982 to Feldman et al. Feldman provides a series of connected vacuum chambers for performing various processing steps on a substrate as it is passed along a transport track which traverses each chamber. Substrates in a stack are introduced to the system through a loadlock valve and are individually placed on the support track so that their principal faces are parallel to the direction of travel along the transport track. With this arrangement the amount of substrate material that can be accommodated at any one time within an individual deposition chamber is quite limited, thereby limiting production throughput of the system. Further, vapor baffles that form separators between the deposition chambers are of the stationary type and rely on close proximity with the principal faces of the substrates being coated to prevent cross contamination between chambers. Steps must be taken to assure that the baffles clear the moving substrate surfaces to prevent damage thereto.

What is needed is an apparatus for large-scale continuous deposition of substrates having improved throughput of coated substrates and baffles that effectively prevent cross contamination between deposition chambers.

SUMMARY OF THE INVENTION

According to the present invention there is shown a deposition system for coating films on substrates. There is provided a vacuum chamber having two opposite ends arranged on a longitudinal axis of the chamber and a plurality of subchambers spaced apart along the longitudinal axis within the chamber. An inlet interlock means adjacent one of the two opposite ends is arranged for introducing the substrates into the vacuum chamber while maintaining a predetermined pressure therewithin. An outlet interlock means adjacent the other of the two opposite ends is arranged for removing the substrates from the vacuum chamber while maintaining the predetermined pressure therewithin. A transport means is included for holding the substrates so that a principal face of each is perpendicular to the longitudinal axis and for imparting continuous motion to the substrates along the longitudinal axis and through each of the subchambers.

The inlet means and outlet means associated with each of two of the plurality of subchambers and disposed on opposite sides of the longitudinal axis are arranged for effecting a flow of reactant gas therethrough in a direction substantially normal to the longitudinal axis of the chamber. A means is provided for activating the reactant gas to effect the coating of the films. A means is provided for inhibiting flow of the reactant gas from one of the two subchambers to the other of the two subchambers.

DESCRIPTION OF THE PREFERRED EMBODIMENT

Deposition equipment of the present invention normally requires different specific features for the manufacture of a particular device. Described herein in detail is a positive column glow discharge deposition system especially suited for the production of large solar cell modules, such as p-i-n cells made of hydrogenated amorphous silicon.

Figure 1:
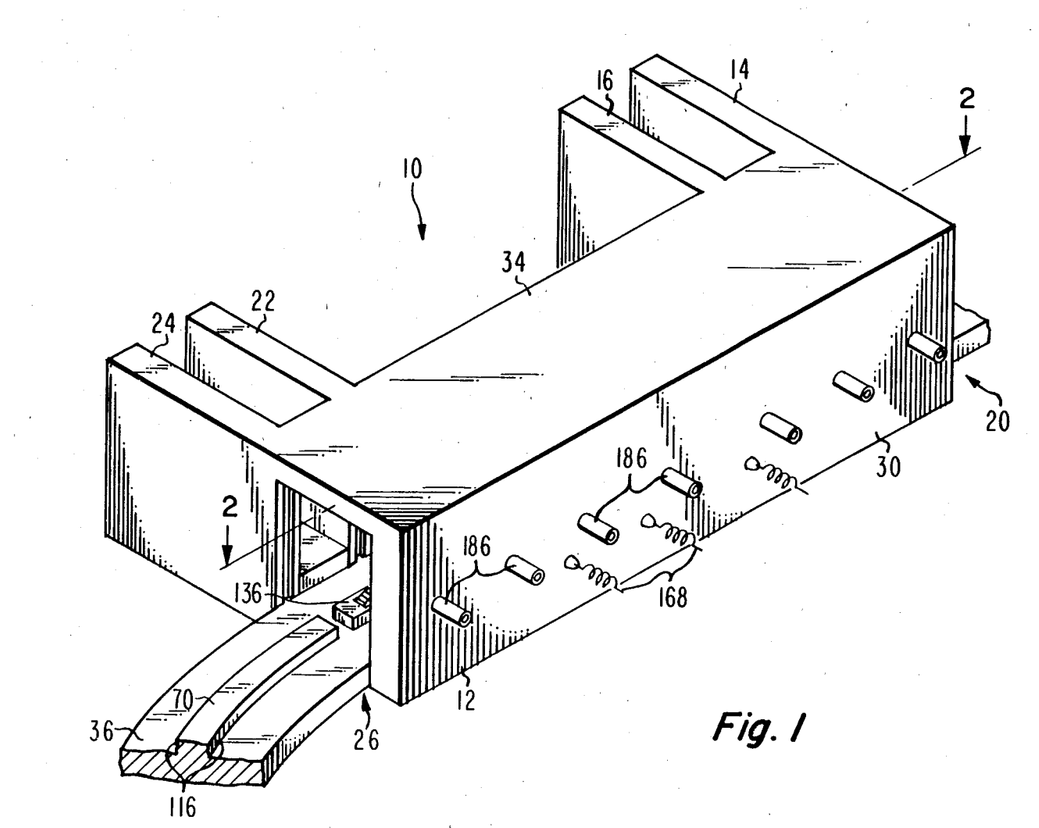
FIG. 1 is an isometric view of a continuous in-line positive column glow discharge deposition apparatus having the teachings of the present invention incorporated therein.
Figure 2:
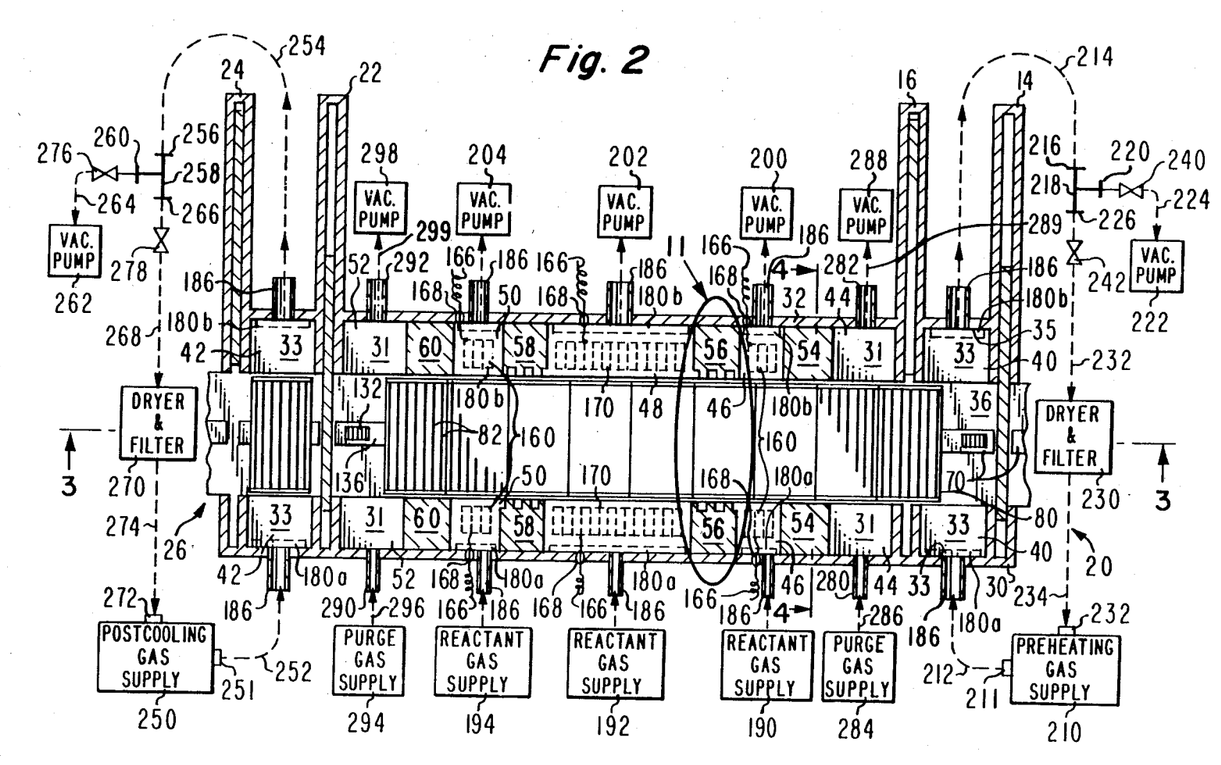
FIG. 2 is a sectional view taken along the lines 2—2 of FIG. 1.
Figure 3:
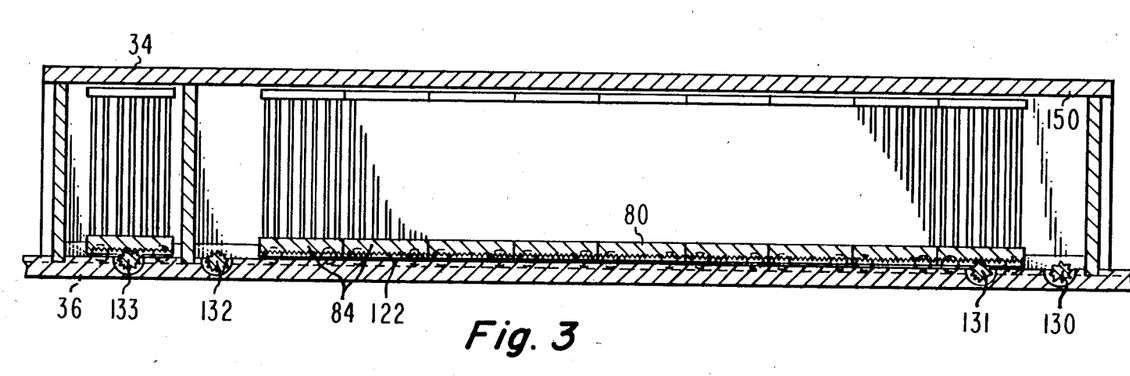
FIG. 3 is a sectional view taken along the lines 3—3 of FIG. 2.
Figure 4:
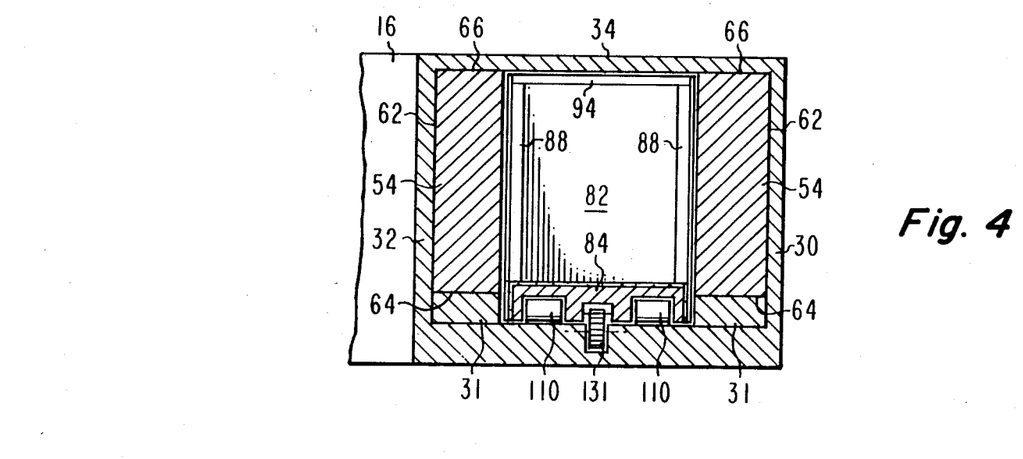
FIG. 4 is an end sectional view taken along the lines 4—4 of FIG. 2.

With reference to FIGS. 1, 2, 3, and 4, there is shown a deposition apparatus 10 having a housing 12, a pair of loadlock valves 14 and 16 positioned adjacent an imput end 20 and a pair of loadlock valves 22 and 24 positioned adjacent an output end 26. The loadlock valves may be any suitable gate valves that are commercially available for use in vacuum type deposition apparatus. As best seen in FIG. 2, the apparatus 10 comprises a front wall 30, a rear wall 32, a top 34 that is shown in FIG. 4, and a base 36. The walls 30, 32, top 34, and base 36 may be of welded construction thereby obviating the need for expensive gasket seals and precision mating surfaces. The interior includes a loadlock cavity 40 disposed between the valves 14 and 16, for loading substrates into the apparatus, a loadlock cavity 42 disposed between the valves 22 and 24 for unloading coated substrates, and a main vacuum chamber consisting of five subchambers 44, 46, 48, 50, and 52. A raised floor 31 consisting of two elongated members having a rectangular cross section, as shown in FIG. 4, are disposed, one on each side of the main vacuum chamber and running the entire length thereof. Similar raised floor members 33 are disposed in the loadlock cavities 40 and 42. The raised floor members are in sealing contact with the base 36 and the walls 30, 32. The subchambers are separated and partially defined by the pairs of baffles 54, 56, 58, and 60 which are parallelepipeds having one face 62 in sealing contact with the walls 30, 32 and one end 64 in sealing contact with the raised floor 31 and the other end 66 in sealing contact with the top 34, as best seen in FIG. 4. The baffles 54, 56, 58, and 60 may be of hollow construction with suitable vents and purging equipment associated therewith for preventing the trapping of gases therewithin. The baffles are held in place by suitable screw fasteners, not shown, that do not penetrate to the outside of the apparatus 10. The base 36 of the apparatus 10 includes a raised rib or key 70 which runs the entire length of the apparatus 10 for engaging and guiding substrate transports 80 through the apparatus.

Figure 7:
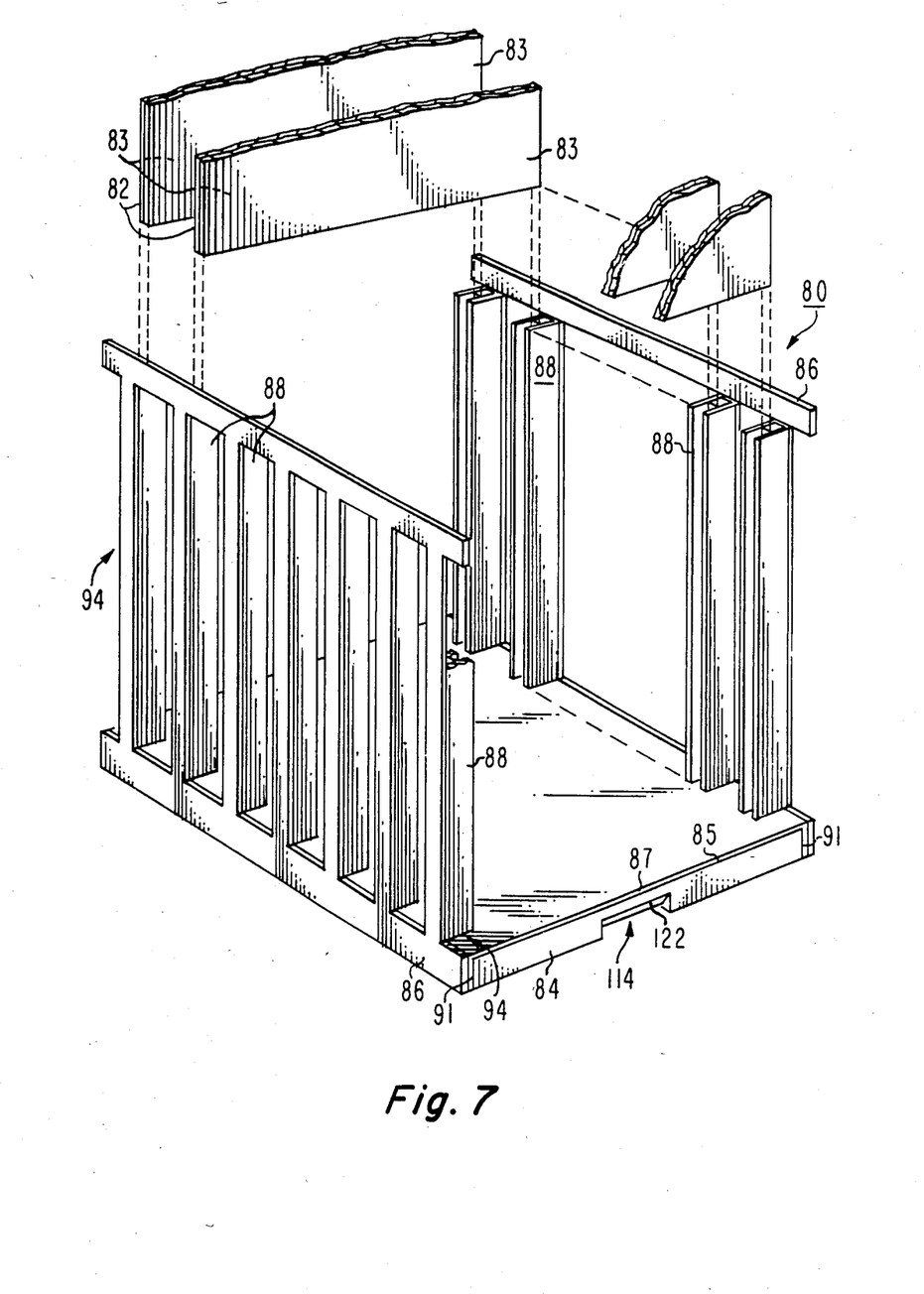
FIG. 7 is an isometric view of a carriage for positioning and moving substrates within the deposition apparatus of FIG. 1.
Figure 8:
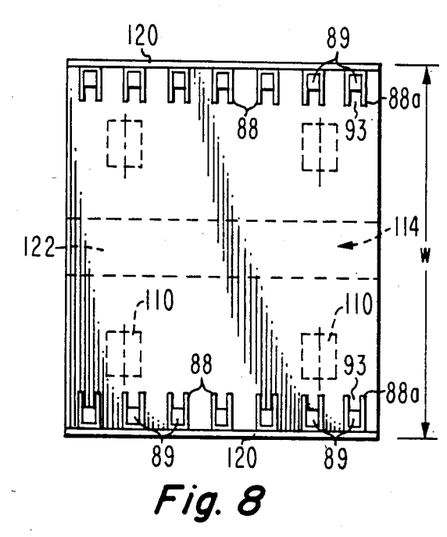
FIG. 8 is a top view of the apparatus shown in FIG. 7.
Figure 9:
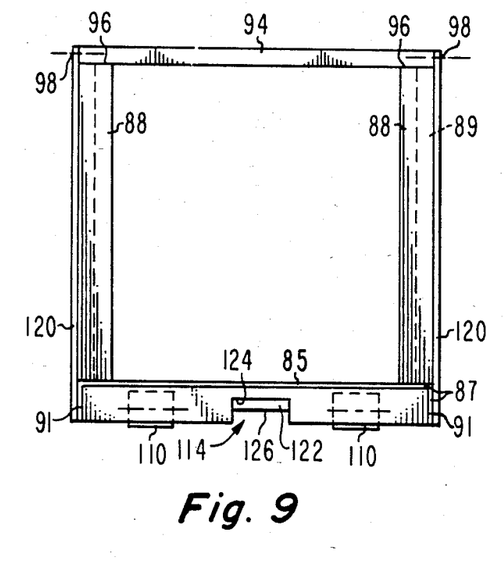
FIG. 9 is an end view of the apparatus shown in FIG. 7.

The substrate transports 80, or carriers, as best seen in FIGS. 7, 8, 9, and 10, are each constructed to hold a plurality of pairs of substrates 82 in a vertical position so that the gases and the glow discharge will pass between the opposing principal faces 83 of the substrates. The carrier 80 has a steel bottom 84, a pair of sloted sides 86 of which contain a plurality of rectangular slots, or perforations, 90 which form upright members 92 therebetween. The sloted sides 86 are rigidly attached to the bottom 84 by suitable screw fasteners, not shown. A series of metal U-shaped substrate holders 88 are attached to the inside surfaces of the upright members 92 with suitable screw fasteners, not shown. An upper surface 85 and two side surfaces 91 of the bottom 84, as shown in FIGS. 7 and 9, are covered with a layer of insulating, non-porous, ceramic 87, Pyrex glass, or equivalent material to prevent biasing or shorting out of the glow discharge electric field by the bottom 84. The screw fasteners which attach the slotted sides 86 to the bottom 84 must also be insulated or otherwise prevented from directly touching the metal sides 86. This can easily be done by use of ceramic washers and spacers that are well known in the art. The substrate holders 88 are arranged in paired alignment on opposite sides of the carrier 80, as shown in FIG. 8. Each such pair of substrate holders will accommodate two substrates back to back. Such a pair of substrate holders is indicated as 88a in FIG. 8.

Each substrate holder is of U-shaped cross-section having a leg length of about one inch and an inside width sufficient to loosely receive a pair of back-to-back substrates 82. Substrate thicknesses of about $\frac{1}{4}$ inch would be ideally accommodated by the presently described substrate holder 88, however, other thicknesses both larger and smaller would also be suitable. A filler member 89 is contained within each of the U-shaped substrate holders as is shown in FIG. 8. The filler members are of a suitable size so that the remaining spaces 93 between the two legs of the substrate holders 88 are about $\frac{3}{8}$ of an inch deep. Therefore, when a pair of substrates 82 is properly inserted into a pair of substrate holders 88a, the legs of the substrate holders overlap the substrates about $\frac{3}{8}$ inches. The one inch length of the metal leg of the substrate holder is advantageous in that the metal attracts electrons and ions which bombard it due to accumulation of electrical charge in that area. This reduces bombardment of the substrates thereby reducing damage to the growing film.

Figure 10:
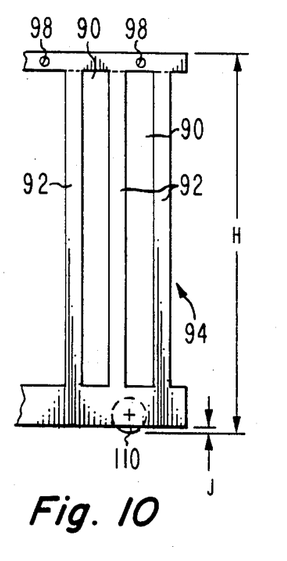
FIG. 10 is a partial side view of the apparatus shown in FIG. 7.

As best seen in FIGS. 3 and 10, there are six slots 90 formed in each carrier and an open slot 94 at each end thereof. The open slots 94 are one-half the width of the slots 90 so that when two carriers 80 are arranged end to end in abutting engagement the open slots 94 of each carrier together form an opening similar to that of the slots 90. With the pairs of substrates assembled in each of the substrate holders 88, the principal faces 83 of the substrates and the open slots 90 form passageways of typically 1 to 3 inches width for passage of gases and glow discharge completely through the carrier 80 as viewed in FIGS. 3, and 10. A top plate 94 made of insulating material such as borosilicate glass, Pyroceram, or other suitable high temperature insulating materials, rests on the top ends 96 of the substrate holders 88 and is fastened in place by suitable screw fasteners 98.

Four wheels 110 are journaled for rotation in the bottom 84 and arranged to support the entire weight of the carrier 80 loaded with a full complement of substrates 82. The wheels 110 may be of any suitable style or design, which is commercially available. Since this weight is substantial, the bottom 84 must be constructed of a suitable material, such as steel, and designed to evenly distribute the weight of the substrates 82 to the four wheels 110. A honeycomb completely enclosed by a skin or flat plates, or similar structure can be used. This skin is required to prevent or minimize the trapping of gases within the honeycomb structure as it moves through a subchamber which may then contaminate the gases of an adjacent subchamber as the carrier is moved from one to the other. A guide slot 114 is formed in the bottom 84, as shown in FIGS. 8 and 9, for the length of the carrier 80. The guide slot 114 has a width which loosely engages the sides 116 of the key 70 formed in the floor 36 so that the carrier 80 may be guided while being moved along the longitudinal axis of the apparatus 10. The amount of clearance between the sides 116 and the corresponding sides of the guide slot 114 should be sufficiently small so that the sides 120 of the carrier 80 will not touch any surface or part of the interior of the apparatus 10 while moving therethrough.

The guide slot 114 serves one additional function. A rack gear 122 is disposed in the bottom 124 of the guide slot 114 with gear teeth 126 facing downwardly, as viewed in FIG. 9. The guide slot 114 is of sufficient depth so that the key 70 will adequately engage the slot 114 without contacting the gear teeth 126. Four spur gears 130, 131, 132, and 133 are journaled for rotation in the floor 36, as shown in FIGS. 3 and 4, and project above the top surface 136 of the key 70 to engage the teeth 126 of the rack gear 122 when a carrier 80 is positioned thereover. The four spur gears are individually controllably rotatable by any suitable power source and shafting arrangement. Such structures are well known in the art of mechanics and therefore are not shown here. The spur gears 130 and 131 are arranged so that carriers having substrates to be coated may be advanced from the loadlock cavity 40, through the subchambers 44,46,48, and 50. The spur gears 132 and 133 are arranged to advance the carriers into the loadlock cavity 42 for removal. Specific details of this operation will be described below.

The height of the carrier 80, indicated by H in FIG. 10, is chosen so that the top of the top plate 94 just clears the surface 150 of the interior of the apparatus 10. The wheels 110 of the carrier 80 are arranged to project below the carrier 80 by a small amount indicated by J in FIG. 10. This amount J should be sufficient to provide suitable clearance between the underside of the carriers and the floor of the apparatus 10, however, this clearance should be minimized so that flow of gases and glow discharge therebetween will be minimized. The width of the carrier 80, indicated by W in FIG. 8 is chosen so that the sides 120 will clear the sides of the raised floor 31, the inwardly facing sides of the baffles 54, 56, 58, and 60 and the loadlock valves 14, 16, 22, and 24 when open. This clearance, however, should be minimized so that the flow of gases and glow discharge between the baffles and the carriers 80 containing substrates is also minimized.

Figure 14:
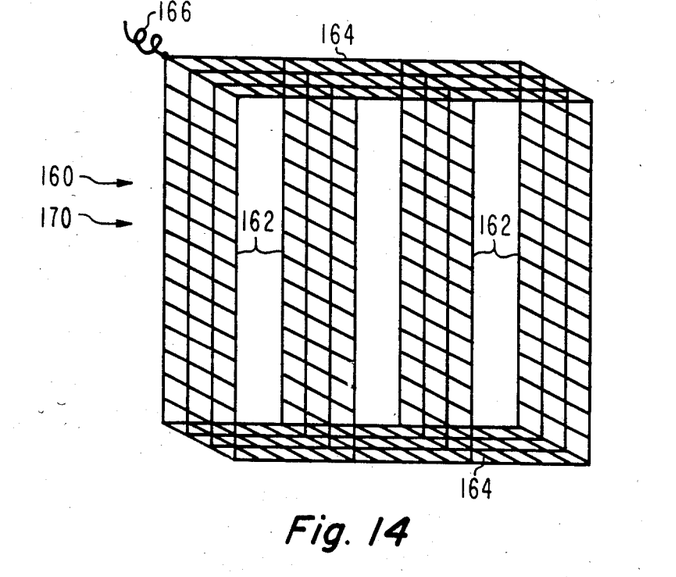
FIG. 14 is an oblique view of a hollow electrode shown in FIG. 2.

A pair of hollow electrodes 160, the structure of one of which is shown in FIG. 14, are arranged in each of the subchambers 46 and 50 as shown in FIG. 2. Each electrode has four vertical elements 162 coupled together and supported by two horizontal elements 164. The vertical elements 162 are spaced apart on intervals equal to the spacing of the substrate pairs in the carriers 80. The elements comprise a metal screen material having a suitable mesh size. Electrodes having a mesh size of about ¼ inch were tested and found to work well, however, the exact mesh size is not considered critical to the operation of the present invention. The electrodes 60 are supported within their respective chambers by suitable insulating standoffs, not shown, and arranged with their vertical elements 162 perpendicular to the direction of movement of the substrate carriers 80 and spaced apart therefrom a distance of approximately one to three inches. An electrical lead 166 is attached to each electrode 160 and passed through a sealing insulated feed through 168 to a point outside the walls 30 and 32. The leads 166 are connected to a suitable power supply, not shown, to energize the electrodes during deposition. The power supply may supply direct current, alternating current, or radio frequency current.

Similarly a pair of hollow electrodes 170 having fifteen vertical elements 162, but otherwise the same as the electrode 160, are arranged within the subchamber 48, as shown in FIG. 2, and supported in a similar way. A lead 166 is attached to the electrode 170 and passed through a feed through 168, as with the electrode 160, and connected to a suitable power supply, not shown. The metal surfaces surrounding the electrodes 160 and 170 within the subchambers should be covered with a layer of insulating, non-porous material such as Pyrex glass or other suitable material to prevent inadvertent shorting out of the electrodes.

Figure 15:
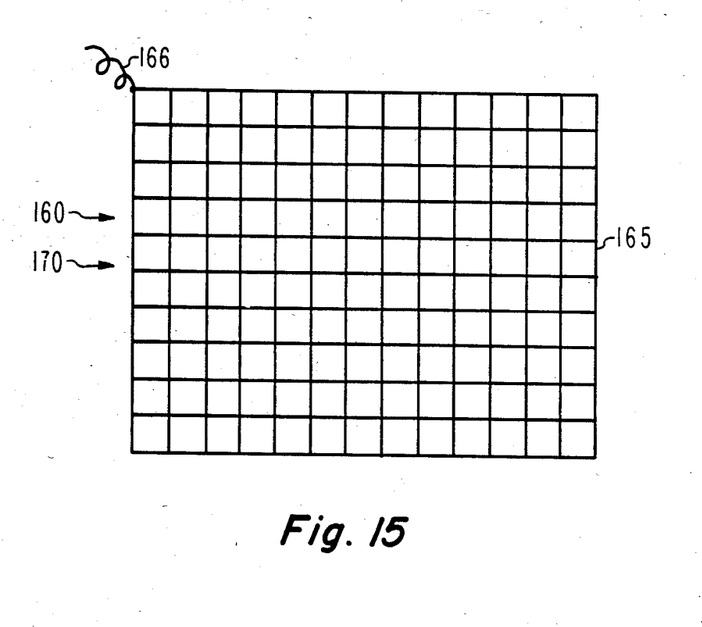
FIG. 15 is a plan view of a flat electrode alternative to that shown in FIG. 14.

An alternative structure for the electrodes 160 and 170 is shown in FIG. 15. This is simply a flat rectangular wire screen 165 having a mesh size of approximately ¼ inch. As with the hollow electrode, the mesh size is not critical to the operation of the present invention. The exact positioning of the flat electrodes in the subchambers 46,48, and 50 is also not critical, the only requirement being that the electrode be spaced apart from the carriers 80 a distance of approximately one to three inches.

Figures 12, 13:
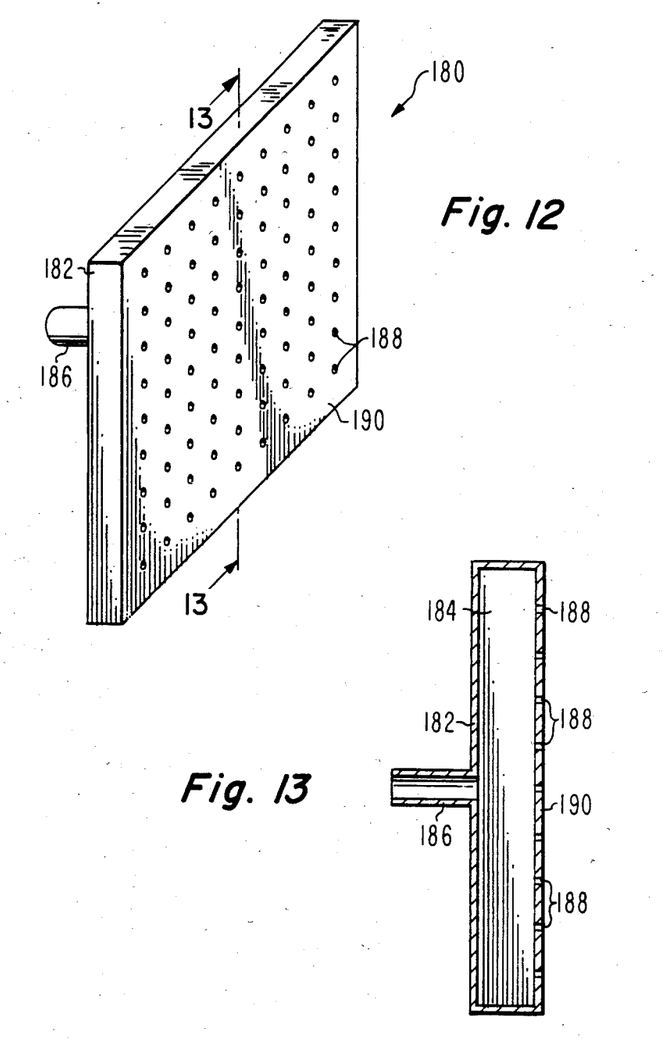
FIG. 12 is an oblique view of a gas distributor shown in FIG. 2.
FIG. 13 is a sectional view taken along the lines 13—13 of FIG. 12.

FIGS. 12 and 13 show a typical diffusor structure 180 which is used in the apparatus 10 as both a gas distributor 180a and a gas collector 180b. The structure includes an enclosure 182 having an interior 184 and a port 186 in the form of a tube which is in communication with the interior 184. A series of holes 188 or perforations are formed in the surface 190 which is opposite the surface containing the port 186. The sum of the cross sectional areas of the holes 188 should be equal to or somewhat less than the cross sectional area of the port 186 to assure that passage of gas through the holes 188 is slightly restricted with respect to passage of gas through the port 186. When the diffusor structure is used as a gas distributor, that is, gas is introduced into the interior 184 under pressure through the port 186, the pressure within the interior 184 will be greater than the ambient thus assuring a flow of gas from the interior 184 through each of the holes 188 and outwardly. When the diffusor structure is used as a gas collector, that is, the port 186 is connected to a vacuum source, the pressure within the interior 184 will be less than the ambient thereby assuring a flow of gas through each of the holes 188 in the opposite direction. In both cases a pressure differential exists on each side of the holes 188 thereby assuring a flow of gas therethrough. A relatively large number of holes 188 is preferred to a small number, the holes being evenly distributed over the surface 190.

There are five such gas distributors 180a disposed in the subchambers 46,48, and 50 and the two loadlock cavities 40 and 42, the gas distributors being arranged in contact with the inside surface 33 of the wall 30 and with their surfaces 190 spaced apart from the electrodes 160, 170 a distance of approximately one to four inches. There are also five such gas collectors 180b disposed in the subchambers 46, 48, and 50 and the two loadlock cavities 40 and 42 opposite to and corresponding with the gas distributors 180a. The gas collectors are arranged in contact with the inside wall 35 of the wall 32 and with their surfaces 190 spaced apart from the electrodes 160, 170 a distance of approximately one to four inches. The relative positions of the gas distributors 180a and gas collectors 180b are best shown in FIG. 2. As is shown, each of the gas distributors 180a and gas collectors 180b have ports 186 that project through openings in the walls 30 and 32 respectively. Suitable vacuum seals, not shown, are provided to prevent entry of contaminants through the openings and into the subchambers.

Reactant gas supply 190 containing gases for depositing p-type a-Si:H,B, or a-Si,C:H,B, gas supply 192 containing gases for depositing i-type a-Si:H, and gas supply 194 containing gases for depositing n-type a-Si:H are connected, by suitable conduits, to the ports 186 of the subchambers 46, 48, and 50 respectively as is well known in the art. The ports 186 projecting through the wall 32 at the opposite ends of the subchambers 46, 48, and 50 are connected, via suitable conduits, to separate vacuum pump systems 200, 202, and 204 respectively.

These vacuum pump systems 200, 202, and 204 are capable of evacuating the subchambers to a pressure of 0.01 torr and maintaining this pressure for extended periods of time.

A preheating gas supply unit 210, which supplies dry clean inert gas at a suitable temperature for preheating the substrates and carriers prior to entering the deposition chamber, has its outlet 211 connected, via a suitable conduit 212 to the port 186 of the cavity 40 that projects through the wall 30. The oppositely disposed port 186 projecting through the wall 32 is connected, via a suitable conduit 214, to an inlet 216 of a T connector 218. An outlet 220 of the T connector 218 is connected to a vacuum pump 222 via a suitable conduit 224. The other outlet 226 of the T connector 218 is connected, via a suitable conduit 232, to a dryer and filter unit 230 which in turn is connected to the intake 232 of the preheating gas supply unit 210 via a suitable conduit 234. A pair of shut-off valves 240 and 242, one being disposed in the conduit 224 and the other being disposed in the conduit 232, are arranged to selectively permit circulation of preheated gas through the cavity 40 or evacuation thereof.

Similar to the preheating gas supply unit 210 there is provided a postcooling gas supply unit 250 which supplies dry clean inert gas at a suitable temperature for cooling the substrates and carrier 80 prior to removal thereof from the system. The outlet 251 of the postcooling unit 250 is connected, via a suitable conduit 252, to the port 186 of the cavity 42 that projects through the wall 30. The oppositely disposed port 186 projecting through the wall 32 is connected, via a suitable conduit 254, to an inlet 256 of a T connector 258. An outlet 260 of the T connector is connected to a vacuum pump 262 via a suitable conduit 264. The other outlet 266 of the T connector 258, is connected, via a suitable conduit 268, to a dryer and filter unit 270 which in turn is connected to the intake 272 of the postcooling gas supply unit 250 via a suitable conduit 274. A pair of shut-off valves 276 and 278, one being disposed in the conduit 264 and the other being disposed in the conduit 268, are arranged to selectively permit circulation of cooling gas through the cavity 42 or evacuation thereof.

The ports 280 and 282 formed in the walls 30 and 32 respectively, adjacent the loadlock valve 16, communicate with the subchamber 44. The port 280 is connected to a purge gas supply 284 containing an inert gas such as helium, neon, argon, or hydrogen via a suitable conduit 286. The port 282 is connected to a vacuum pump 288 via a suitable conduit 289.

The ports 290 and 292 formed in the walls 30 and 32 respectively, adjacent the loadlock 22, communicate with the subchamber 52. The port 290 is connected to a purge gas supply 294 containing an inert gas, similar to the gas supply 284, via a suitable conduit 296. The port 292 is connected to a vacuum pump 298 via a suitable conduit 299.

Figure 11:
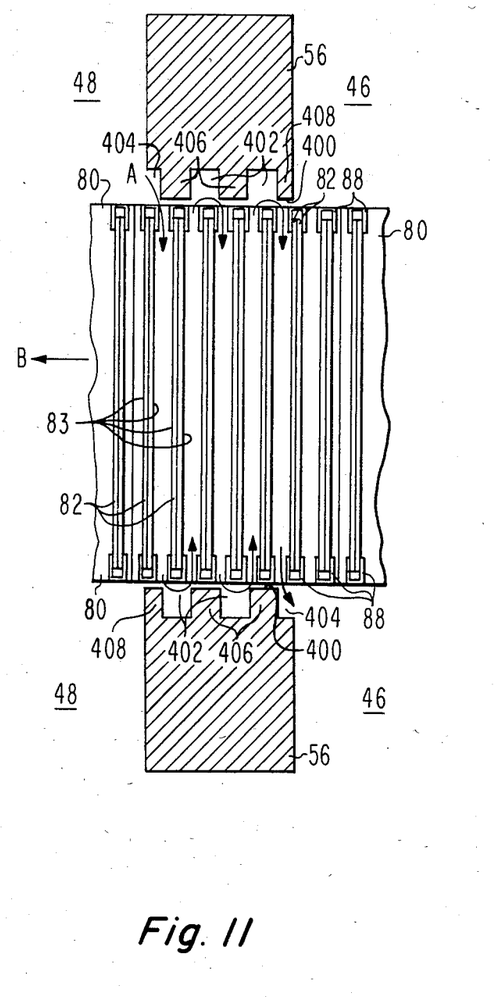
FIGS. 11,11a, and 11b are enlarged views of the area indicated at 11 in FIG. 2, each view depicting a different embodiment.

FIG. 11 depicts, at a larger scale, the area encircled and indicated by 11 in FIG. 2. There is shown a carrier 80 with the top plate 94 removed, portions of two adjacent carriers 80, and a pair of baffles 56 straddling the carrier 80. Note that both baffles 56 are identical in structure, the lower one being turned 180 degrees from the upper one, as viewed in FIG. 11. Each baffle 56 has a planar surface 400 facing the substrate holders 88 and perpendicular to the substrate principal faces 83. A series of vertically disposed and equally spaced depressions or grooves 402 are formed in the planar surfaces 400. A half groove 404, which is exactly one-half the width of one of the grooves 402, is formed in an edge of the surface 400 as shown. The grooves 402 and 404 are arranged so that lands 406 are formed therebetween wherein the widths of the lands 406 are substantially equal to the widths of the grooves 402. A half land 408 is formed in the edge of the planar surface 400 opposite the half groove 404 having a width substantially equal to the width of the half groove 404.

Similarly, the baffles 58, which have grooves and lands of opposite hand to those of the baffles 56 prevent contamination of the gases for the deposition of i-type a-Si:H contained within the subchamber 48 by the gases for the deposition of n-type a-Si:H contained within the subchamber 50.

Figure 11A:
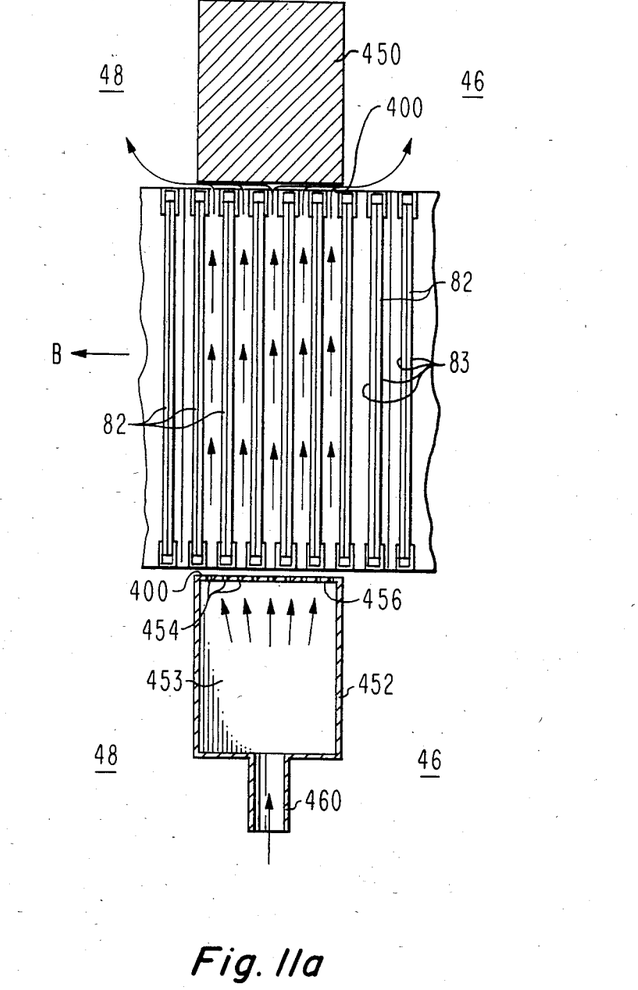

An alternate structure for the pair of baffles 56 is shown in FIG. 11a wherein one baffle 450 is solid and of rectangular cross section and the other baffle 452 has a hollow interior 453 and a series of relatively small holes 454 formed through the wall 456. As with baffles 56, the baffles 450 and 452 each have a planar surface 400 facing the substrate holders 88 and perpendicular to the substrates 82. An inlet tube 460 in communication with the interior 453 is connected to a supply of inert or hydrogen gas, not shown. The gas flows out of the holes 454, between the pairs of substrates 82, and diverting to both the left and right, as viewed in FIG. 11a, upon encountering the planar surface 400 of the baffle 450. The gas that diverts to the left enters the subchamber 48 at the end adjacent the exit port 186 and therefore is immediately evacuated by the vacuum pump 202. Similarly the gas that diverts to the right enters the subchamber 46 and is evacuated by the vacuum pump 200.

Figure 11B:
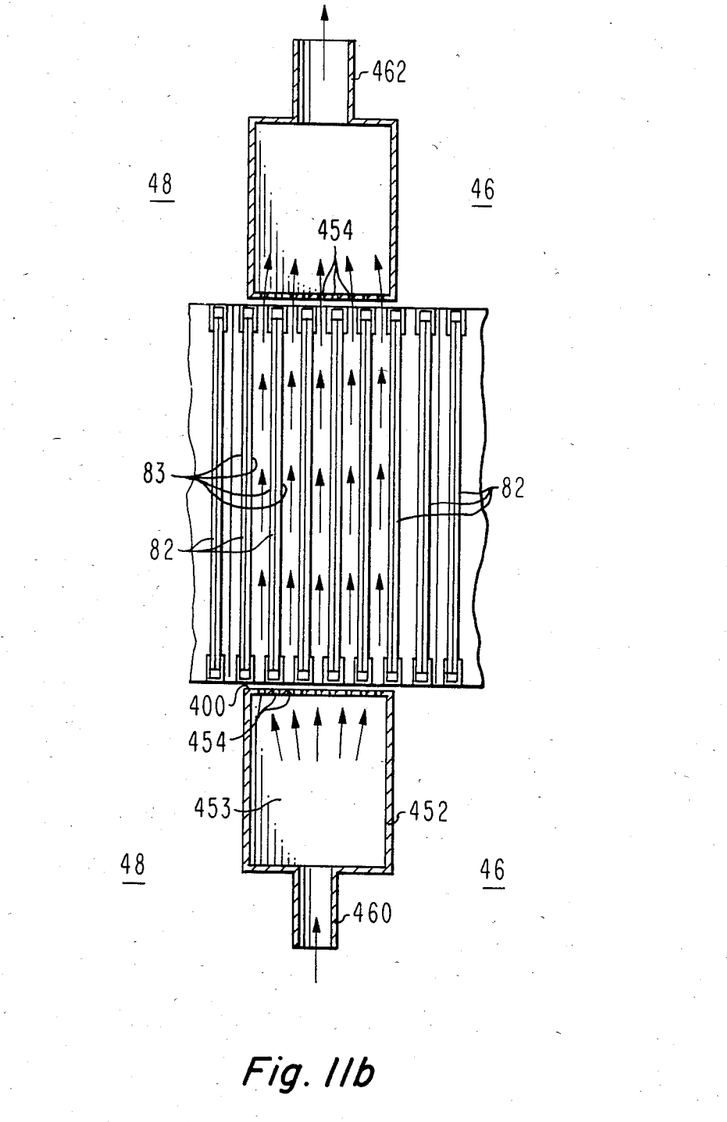

Another alternate structure for the pair of baffles 56 is shown in FIG. 11b wherein both baffles are substantially identical to the baffle 452 shown in FIG. 11a, the only difference being that the tube 462 is larger than the tube 460 and is attached to a vacuum pump, not shown. With this arrangement the inert or hydrogen gas flows out of the holes 454 of the baffle 452 connected to the gas supply, past the pairs of substrates 82, into the holes 454 of the top baffle, which serves as a gas collector, and out the exhaust tube 462. While these alternate structures are feasible the preferred structure is that shown in FIG. 11.

Figure 5:
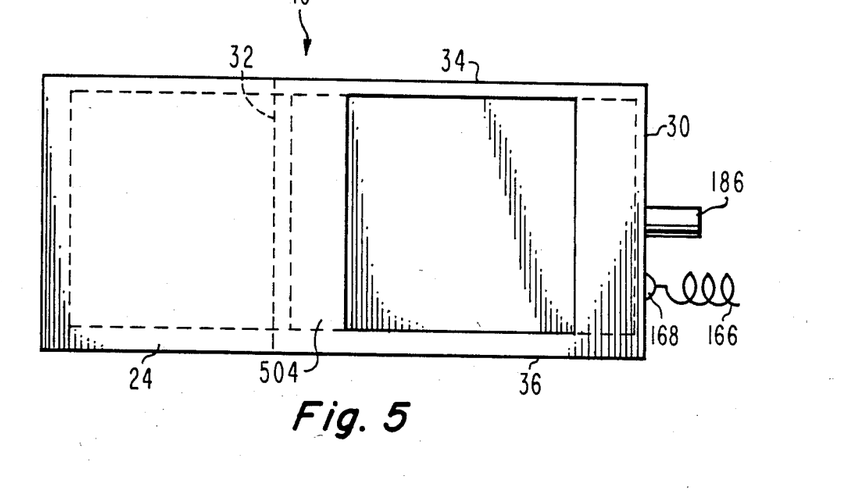
FIG. 5 is an end view of the apparatus shown in FIG. 1.
Figure 6:
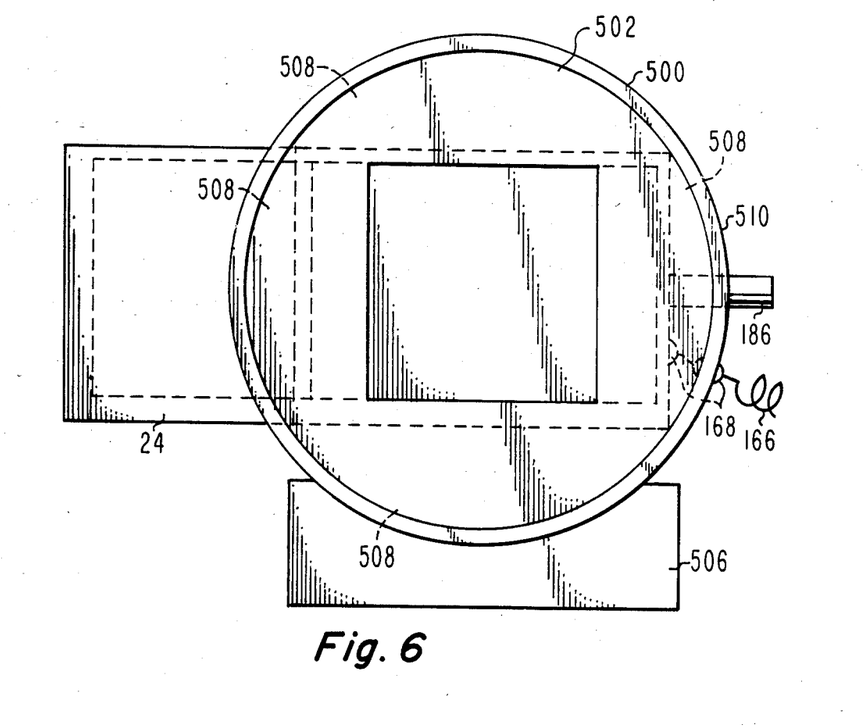
FIG. 6 is an alternative embodiment of that shown in FIG. 5.

With reference to FIGS. 5 and 6 there are shown two configurations of the apparatus 10. FIG. 5 shows an end view of the apparatus 10 as described above. FIG. 6 shows a similar view but with a cylindrical member 500 disposed about the apparatus 10 for its entire length. Bulkheads 502 are provided at each end of the member 500 and are in sealing engagement with, or welded to the ends 504 of the apparatus 10. A plurality of cradles or supports 506 are spaced along the cylindrical member 500 suitable to support its weight including the weight of a full complement of carriers 80 and substrates 82. The advantage of this structure is that the interior 508 of the cylindrical member 500 would be evacuated to a pressure very nearly that within the apparatus 10. This would permit considerably lighter construction of the walls 30, 31, and top 34 as well as the cylindrical member 500. The ports 186 project through the side 510 of the member 500 and are suitably sealed therewith to maintain the vacuum within the interior 508.

In operation, substrates are loaded into a carrier 80 and the top plate 94 securely fastened in place. Assuming that the apparatus 10 contains a full complement of carriers 80, as shown in FIG. 2, and that the system is functioning in that deposition is taking place. The substrates 82 held in the carriers 80 will be in various stages of completion depending on their relative positions within the subchambers. As the first carrier 80, located within the loadlock 40, advances due to the action of the gears 130 and 131, it abuts the carrier 80 immediately preceding it thereby urging that carrier and all other carriers 80 in front thereof to likewise advance. Suitable means, not shown, is provided to prevent inadvertent or premature advancement of the carriers 80 when the gears 130 and 131 are inoperative. Once the first carrier 80 advances to the point where it is completely within the subchamber 44, the loadlock valve 16 is closed, and the pressure within the cavity 40 is raised to atmospheric. The loadlock valve 14 is then opened and a new carrier 80 containing substrates ready for coating is loaded into the cavity 40. The loadlock valve 14 is then closed, the cavity evacuated, and then flooded with preheated inert gas circulated from the gas supply unit 210 at a pressure of about one atmosphere or greater pressure. The carrier 80 and associated substrates remain in the cavity 40 until they reach a temperature of about 200° to 300° C., after 10 minutes or so.

In the meantime the cavity 42 is evacuated, then pressurized with inert gas or hydrogen to approximately the same pressure as in the subchamber 52. The loadlock valve 22 is then opened, and the lead carrier 80 which had advanced into the subchamber 52 is advanced by the gears 132 and 133 completely into the cavity 42. The loadlock valve 22 is then closed, the pressure within the cavity 42 is raised to atmospheric or greater pressure, and the cavity flooded with cool inert gas circulated from the postcooling gas supply unit 250. When the lead carrier 80 and associated substrates reach a temperature of about 50° C. or less, the loadlock valve 24 is opened, and the carrier removed through the output end 26 by the action of the gear 133 and external mechanism, not shown. The loadlock valve 24 is then closed, the cavity 42 purged with inert gas and evacuated to a pressure substantially equal to that of the subchamber 52.

The gas from the cavity 40 is then evacuated and the pressure within it is adjusted to approximately that in subchamber 44. The valve 16 is then opened and the preheated carrier 80 containing substrates ready for coating is advanced into the subchamber 42 by the gears 130 and 131 and the cycle repeated.

In this way each carrier 80, and each substrate 82 contained therein passes completely through the subchambers 44, 46, 48, 50 and 52 in a continuous uninterrupted motion. The subchamber 44 is a buffer compartment through which an inert gas is caused to flow. This flow of inert gas purges the carrier 80 and associated substrates 82 of contaminants preparatory to deposition. As each substrate 82 moves through the subchamber 46 it is coated with about 10 nanometers of p-type semiconducting material such as a-Si:H,B (hydrogenated amorphous silicon doped with boron) or a-Si,C:H,B (hydrogenated amorphous silicon-carbon doped with boron). Each substrate 82, in turn, then passes into the subchamber 48 where it receives a coating about 510 nanometers thick of i-type a-Si:H. Note, as shown in FIG. 2, that the length of the subchamber 48 is large compared to that of the subchamber 46. Since the substrates pass through the apparatus 10 at a constant rate, they spend relatively more time in the subchamber 48 and therefore receive a thicker coating. The relative thicknesses of the coatings deposited within the three subchambers 46, 48 and 50 may be varied by simply altering the relative lengths of the subchambers. Each substrate 82, in turn then passes into the subchamber 50 where it receives a coating about 30 nanometers thick of n-type a-Si:H,P. As the substrates 82 pass through the subchamber 52, an inert gas flowing through the subchamber purges the substrates and carrier 80 of all reactant gases preparatory to removal from the system.

As the substrates 82 pass from subchamber to subchamber the transition from one gas to another takes place without harmful cross-contamination. This is accomplished firstly by maintaining a slightly higher pressure, on the order of 10 to 100 millitorr higher, within the subchambers 44, 48, and 52 than is maintained within the subchambers 46 and 50 and secondly by appropriate channelling of the gases into desired locations by use of the novel baffles 56 and 58. For example, the reactant gases contained within the subchamber 48, being of a slightly higher pressure than the reactant gases contained within the adjacent subchamber 46, will tend to flow toward and into the subchamber 46 as indicated by the arrow A in FIG. 11. Since the gases for the deposition of the i layer within the subchamber 48 contain no dopant, no contamination will occur of the p gases within the subchamber 46. Since the lands 406 of each baffle 56 are in alignment with the grooves 402 of the other baffle 56 a back and forth pathway is established between the pairs of substrates 82. The flow of the reactant gas, as indicated by the arrow A and succeeding curved annoeus, from the subchamber 48 to the subchamber 46 therefore follows a labyrinth path back and forth between the two baffles 56 and between all of the pairs of substrates 82 as they move between the two baffles 56 in the direotion indicated by B in FIG. 11. This flow along a labyrinth path effectively prevents contamination of the gases for the deposition of i-type a-Si:H contained within the subchamber 48 by the gases for the deposition of p-type a-Si:H contained within the subchamber 46. The apparatus 10 is designed to operate at pressures from about 0.1 torr to about 2.0 torr as is typical in the art.

The present invention, therefore, permits a completely continuous deposition process in the manufacture of large semiconductor devices such as solar cells. It is contemplated that apparatus as described herein can accommodate substrates on the order of about 4 feet square or larger although smaller substrates could be accommodated. The length of the subchamber 46,48, and 50 can be adjusted to effect a desirable production throughput. For example, a subchamber 48 having a length of about 6 feet would permit processing about 200 substrates per hour. This is many times greater than any deposition system heretofore in use for substrates substantially smaller in size than the 4 feet square, or larger, substrates that are possible with the present invention.

Since the principal face of each substrate, that is the face being coated, is maintained parallel to the electric field of the glow discharge while at the same time perpendicular to the direction of movement of the substrate through the apparatus, the novel carriage described above can be utilized. Because the reactant gases are substantially confined by the substrate carrier, the walls of the apparatus 10 remain substantially free of deposits. Further, since the carriers and associated substrates are preheated in the cavity 40 and the glow discharge occurring within the subchambers 46,48, and 50 add substantial heat to the system, there is no need for continuous heating of the substrates by an external source.

The foregoing description sets forth a deposition process wherein the gas activation is effected by glow discharge. The same or similar equipment can be used in conjunction with thermal activation of the gases as in the LPCVD method. In this case the charging means is not needed. Instead, the gas is heated to its decomposition temperature by external heating apparatus.

Although, the apparatus 10, as set forth above, is arranged for the deposition of hydrogenated amorphous silicon in the manufacture of solar cells it is contemplated that it will work well with the deposition of other materials and device structures. Such other applications of the apparatus 10 may require other process gases and a greater or smaller number of subchambers. Such arrangements shall be understood to be within the spirit and scope of this invention.

I claim:

1. A deposition system for coating films on substrates comprising:
    (a) a vacuum chamber having two opposite ends arranged on a longitudinal axis of said chamber and a plurality of subchambers spaced apart along said longitudinal axis within said chamber;
    (b) a transport means including a plurality of carriers for holding a plurality of said substrates euqally spaced so that a principal face of each of said substrates is substantially perpendicular to said longitudinal axis and for imparting motion to said substrates along said longitudinal axis and through each of said plurality of subchambers, each of said carriers comprising a bottom and a plurality of spaced apart substrate holders attached to said bottom and arranged in pairs so that when said one of said carriers is positioned between said two subchambers, one of each of said pairs of substrate holders is parallel to and closely adjacent a first planar surface of a first baffle and the other of each of said pairs of substrate holders is parallel to and closely adjacent a second planar surface of a second baffle;
    (c) inlet means and outlet means associated with each of two of said plurality of subchambers and disposed on opposite sides of said longitudinal axis for effecting a flow of reactant gas therethrough in a direction substantially normal to said longitudinal axis of said chamber;
    (d) means for activating said reactant gas to effect said coating of said films; and
    (e) a means for inhibiting flow of said reactant gas from one of said two subchambers to the other of said two subchambers comprising:
        (i) a first baffle having a first planar surface and a second baffle having a second planar surface, said first and second baffles being disposed between said two subchambers on opposite sides of said longitudinal axis so that said first and second planar surfaces are opposed and substantially parallel to each other and to said longitudinal axis, wherein said first and second planar surfaces have a plurality of equally spaced vertically disposed depressions and lands formed therein, one of said lands being between each two adjacent depressions, wherein said depressions of said first planar surface are opposite to and in alignment with said lands of said second planar surface; and
        (ii) means for effecting a flow of gas from one of said first and second planar surfaces to the other of said first and second planar surface.

2. The apparatus set forth in claim 1 wherein said plurality of depressions and said plurality of lands are of substantially equal width and have substantially equal center to center distances.

3. The apparatus set forth in claim 2 wherein said plurality of substrate holders are equally spaced having a center to center distance substantially equal to one-half of said center to center distance of said plurality of depressions.

4. The apparatus set forth in claim 3 wherein said deposition system is a positive column glow discharge deposition system and said means for activating said reactant gas includes means for generating an electric field associated with each of said two subchambers for effecting a glow discharge therein and wherein said transport means further holds said substrates so that said principal face of each is substantially parallel to said electric field.

5. The apparatus set forth in claim 4 wherein said means for generating an electric field comprises a first electrode disposed in each of said two subchambers adjacent said inlet means, a second electrode disposed in each of said two subchambers adjacent said outlet means, and means for applying a voltage thereto.

6. The apparatus set forth in claim 5 wherein one of said anode and said cathode comprises a hollow electrode having a plurality of equally spaced and parallel electrode segments having a center to center distance substantially equal to said center to center distance of said plurality of substrate holders.

7. The apparatus set forth in claim 3 wherein when one of said carriers is positioned between said two subchambers, one of each of said pairs of substrate holders is parallel to and closely adjacent one of said lands formed in said first planar surface of said first baffle and the other of each of said paris of substrate holders in parallel to said closely adjacent one of said depressions formed in said second planar surface of said second baffle.

* * * * *

UNITED STATES PATENT AND TRADEMARK OFFICE
CERTIFICATE OF CORRECTION

PATENT NO. : 4,593,644

DATED : June 10, 1986

INVENTOR(S) : Joseph J. Hanak

It is certified that error appears in the above-identified patent and that said Letters Patent is hereby corrected as shown below:

```
Column 10, line 32, "annoeus" should be --arrows--.
Column 10, line 36, "direotion" should be --direction--.
Column 11, line 28, "euqally" should be --equally--.
Column 12, line 52, "paris" should be --pairs--.
Column 12, line 52, "in" should be --is--.
```

Signed and Sealed this

Nineteenth Day of August 1986

[SEAL]

Attest:

DONALD J. QUIGG

Attesting Officer

Commissioner of Patents and Trademarks